(12) United States Patent
Jang

(10) Patent No.: US 6,720,218 B2
(45) Date of Patent: Apr. 13, 2004

(54) METHOD FOR MANUFACTURING HORIZONTAL SURROUNDING GATE FLASH MEMORY CELL

(75) Inventor: Wen-Yueh Jang, Hsinchu (TW)

(73) Assignee: Winbond Electronics Corporation, Hsinchu (TW)

(*) Notice: Subject to any disclaimer, the term of this patent is extended or adjusted under 35 U.S.C. 154(b) by 0 days.

(21) Appl. No.: 10/352,912

(22) Filed: Jan. 29, 2003

(65) Prior Publication Data
US 2003/0143798 A1 Jul. 31, 2003

Related U.S. Application Data

(62) Division of application No. 10/024,545, filed on Dec. 21, 2001, now Pat. No. 6,587,396.

(51) Int. Cl.$^7$ .............................................. H01L 21/336
(52) U.S. Cl. ........................ 438/257; 438/258; 438/259
(58) Field of Search ................................. 438/257–259; 257/296–315

(56) References Cited

U.S. PATENT DOCUMENTS 6,238,976 B1 * 5/2001 Noble et al. ................. 438/259

* cited by examiner

Primary Examiner—Dung Le

(57) ABSTRACT

The present invention discloses a structure of a horizontal surrounding gate (HSG) flash memory cell and a method for manufacturing the same. The HSG flash memory cell of the present invention is located on a trench of an isolation region, and a channel region of the HSG flash memory cell composed of a semiconductor film is encompassed by a tunneling oxide layer, a floating gate, and a control gate in sequence. The floating gate and the control gate are also formed on the trench below the channel region. Therefore, the leakage current of the channel can be improved, and the short channel effect cannot be induced by junction depth of a source/drain. Furthermore, the coupling capacitor between the control gate and the floating gate is increased easily by increasing the depth of the trench.

10 Claims, 8 Drawing Sheets

METHOD FOR MANUFACTURING HORIZONTAL SURROUNDING GATE FLASH MEMORY CELL

The invention is a division of the application filed on Dec. 21, 2001 now U.S. Pat. No. 6,587,396, with an application Ser. No. 10/024,545 and entitled "STRUCTURE OF HORIZONTAL SURROUNDING GATE FLASH MEMORY CELL AND METHOD FOR MANUFACTURING THE SAME". The subject matter of the above-identified application is incorporated by reference herein.

FIELD OF THE INVENTION

The present invention relates to a process for manufacturing a flash memory, and more particularly, to a method for manufacturing a horizontal surrounding gate (HSG) flash memory cell.

BACKGROUND OF THE INVENTION

As semiconductor process technologies continue improving, computers, telecommunication products, network products, and information appliances (IA) are developed vigorously. To scale down the size of semiconductor devices is the primary motivation to drive the semiconductor process technologies. By scaling down devices size, the performance, such as the changing speed of devices and the power consumption of devices, can then be improved, and the functions thereof, such as data storage, logic operation, and information processing, can be enhanced. Therefore, the cost can be reduced. Especially, for semiconductor memory devices that have a very important share in the market have strict demands about the diminution of device size.

According to the functional differences, memory devices can be divided into a random access memory (RAM) and a read only memory (ROM). The ROM does not lose the stored data even with the interruption of supplying power and is thus called as a nonvolatile memory. Contrarily, the RAM must keep the supplying power uninterruptedly for reserving the stored data and is thus called as a volatile memory. In addition, according to the ways for storing data, the ROM can be further divided into a mask read only memory (MROM), an erasable programmable ROM (EPROM), an electrically erasable programmable ROM (EEPROM), and a flash memory, etc. Also, according to the structural difference, the RAM can be further divided into a dynamic RAM (DRAM) and a static RAM (SRAM).

As the increasing popularization of portable electric devices, imperious demands for light, handy, and dependable storage devices are induced. Regardless of digital cameras, notebooks, personal digital assistants (PDA), digital music players, or mobile phones, etc, they all need a dependable and convenient method to store and transmit data. Because the data stored in a flash memory can be kept after the power is shut off, flash memory devices are widely applied in the portable electric devices.

Referring to FIG. 1, FIG. 1 shows a cross-sectional view of a conventional stacked gate flash memory cell structure. A flash memory cell 100 is formed on a semiconductor substrate 102, and a tunneling oxide layer 108, a floating gate 110, a dielectric layer 112, and a control gate 114 of the flash memory cell 100 are stacked and formed on the semiconductor substrate 102 in sequence. A source 104 and a drain 106 of the flash memory cell 100 are formed by a thermal diffusion method or an ion implantation method to dope ions into the substrate 102. Typically, the floating gate 110 and the control gate 114 are composed of polysilicon, and thus the dielectric layer 112 is called as an inter-poly dielectric (IPD) layer. Besides, the dielectric layer 112 is usually formed by stacking three material layers, i.e. oxide/nitride/oxide (ONO), thereby to provide a better blocking ability for preventing the chargers within the floating gate 110 from entering the control gate 114.

Typically, the programming of the flash memory cell 100 is performed by a channel hot electron injection (CHEI) method. For example, the channel hot electron injection method is to set the substrate 102 and the source 104 to 0 V, and the drain 106 to about 3 V, and to connect the control gate 114 to a power of high voltage, such as 12 V. At this time, the electrons of the source 104 are driven by the voltage of the drain 106 to pass through the channel region 105 and move toward the drain 106, and the energy of electrons is increased by the acceleration from the high channel electric field. Especially in the channel region 105 that is adjacent to the drain 106, the energy of electrons is greatly increased, thereby inducing the hot electron effect. As a result of the hot electron effect, the electrons have enough energy to exceed the potential barrier of the tunneling oxide layer 108. At the same time, the attraction resulted from the high voltage of the control gate 114 drives the electrons to pass through the tunneling oxide layer 108 and inject into the floating gate 110.

In addition, the erasing action of the flash memory cell 100 is performed by a Fowler-Nordheim (FN) tunneling effect. The FN tunneling effect erasing method can be divided into a channel erasing method and a source/drain erasing method. In the channel erasing method, the control gate 114 is supplied with a negative voltage or is grounded, and the channel region 105 is supplied with a high voltage, such as 12 V, thereby attracting the electrons of the floating gate 110 into the channel region 105 to complete the data erasing. In the source/drain erasing method, the control gate 114 is supplied with a negative voltage or is grounded, and the source 104 and/or the drain 106 are supplied with a high voltage, such as 12 V, thereby attracting the electrons of the floating gate 110 into the source 104 and/or the drain 106 to complete the data erasing.

As semiconductor process technologies continue enhancing, although the supplied voltage needed for performing the programming and erasing of the flash memory cell 100 is reduced, yet the electric field for programming and erasing the flash memory cell 100 still needs the same intensity. Without changing the programming/erasing voltage of the flash memory cell 100, it is very difficult to achieve the desired voltage of programming/erasing while the supplied voltage is reduced. At present, there are two methods can be used to reduce the programming/erasing voltage of the flash memory cell 100. The first method is to decrease the thickness of the tunneling oxide layer 108, and the second method is to increase the capacitor coupling ratio between the control gate 114 and the floating gate 110. Since the thickness of the tunneling oxide layer 108 multiplies the electric field used to program/erase the flash memory cell 100 is proportional to the voltage for programming/erasing the flash memory cell 100, decreasing the thickness of the tunneling oxide layer 108 can reduce the voltage for programming/erasing the flash memory cell 100. However, in order to keep the reliability of the flash memory cell 100, the thickness of the tunneling oxide layer 108 is preferred to be more than 80 Å, and is about 100 Å more preferably. Hence, there is not much room left for decreasing the thickness of the tunneling oxide layer 108. In addition, increasing the capacitor coupling ratio between the control gate 114 and the floating gate 110 can increase the floating gate 110 voltage coupled from the control gate 114, so that the voltage needed to be supplied to program/erase the flash memory cell 100 can be reduced. However, in the typical flash memory cell 100 process, increasing the capacitor coupling ratio between the control gate 114 and the floating gate 110 usually leads to an increase in the size of the flash memory cell 100 and the process cost.

Furthermore, since there is not much room left for decreasing the thickness of the tunneling oxide layer 108, when the supplied voltage is reduced, the electrons ejecting from the source 104 though the channel region 105 to the drain 106 cannot be controlled effectively. Especially, as the device size continues reducing to make the gate region decrease continuously, so that the leakage current of the sub-channel area far from the gate under the channel region 105 is getting more serious. Particularly, for the flash memory cell 100 using the source/drain erasing method, the source 104/drain 106 need a larger junction depth. Thus, the leakage current is getting worse.

SUMMARY OF THE INVENTION

According to the aforementioned conventional flash memory cell structure, the leakage current between a source and a drain is getting worse as devices scaled down. Further, the coupling capacitor between a control gate and a floating gate cannot be increased effectively without increasing the cell size and the processing cost.

Therefore, one major object of the present invention is to provide a method for manufacturing a HSG flash memory cell. After a trench with a size larger than a channel is formed on a channel region, and a plurality of spacers are fabricated beside a sidewall of the trench, a sacrificial layer is filled into the trench. Then, after a channel film is formed on the sacrificial layer, the sacrificial layer inside the trench is removed, so that the channel film traverses over the spacers as a single-plank bridge, and a space is formed between the channel film and the bottom of the trench. By controlling the depth of the space between the channel film and the bottom of the trench, the overlap area between a floating gate and a control gate formed in the space sequentially can be adjusted to improve the capacitor coupling ratio between the floating gate and the control gate.

Another object of the present invention is to provide a method for manufacturing a HSG flash memory cell, and a channel region of the HSG flash memory cell is a thin film surrounded and encompassed by a floating gate and a control gate in sequence, thereby effectively improving the leakage current between a source and a drain. Besides, the channel region is surrounded by the floating gate and the control gate, so that the current of the flash memory cell of the present invention can be conducted in the both sides of the channel region, and the current of the flash memory cell at the on-state is larger than the current of the conventional flash memory cell.

A further object of the present invention is to provide a method for manufacturing a HSG flash memory cell on a trench. A floating gate and a control gate of the HSG flash memory cell encompass a channel film traversed over the trench, and the HSG flash memory cell is also formed on a space between the channel film and the bottom of the trench. By increasing the depth of the trench, the overlap area between the floating gate and the control gate can be increased, so that a capacitor coupling ratio between the floating gate and the control gate can be increased. Therefore, without increasing the size of the hash memory cell, the larger capacitor coupling ratio can increase the coupling voltage of the floating gate, and reduce the programming/erasing voltage of the flash memory cell.

According to objects mentioned above, the present invention further provides a method for manufacturing a HSG flash memory cell, the method comprising: providing a substrate, wherein the substrate comprises an isolation region and a channel region formed thereon, and the size of the isolation region is larger than the size of the channel region, and the entire channel region is surrounded by the isolation region, and the isolation region is filled with an insulating material; removing a portion of the insulating material in the isolation region to form a trench on the isolation region in the substrate; forming a plurality of spacers in the trench and beside a sidewall of the trench; forming a sacrificial layer to cover the isolation region, the trench, and the spacers, wherein the trench is filled with the sacrificial layer, and the spacers and the sacrificial layer are selected from different dielectric materials; forming an amorphous semiconductor film to cover the substrate, the spacers, and the sacrificial layer; performing a re-crystallization step to make the amorphous semiconductor film covered on the substrate integrate into the substrate, and to make the amorphous semiconductor film located on the isolation region change into a crystallized semiconductor film, wherein the temperature of the re-crystallization step is between about 500° C. and about 600° C., and the duration of the re-crystallization step is between about 0.5 hour and about 6 hours; removing a portion of the crystallized semiconductor film to leave an other portion of the crystallized semiconductor film located on the channel region, and to expose a portion of the spacers and a portion of the sacrificial layer; removing the sacrificial layer to expose a bottom of the trench, so as to form a hollow region constituted by an other portion of the crystallized semiconductor film, the spacers, and the bottom of the trench, and to form a plurality of slots between the other portion of the crystallized semiconductor film and the trench; forming an oxide layer to cover the remaining portion of the crystallized semiconductor film, wherein the oxide layer is a tunneling oxide layer; forming a floating gate to cover the oxide layer, a sidewall of the hollow region, and a bottom of the hollow region; forming a dielectric layer to cover the floating gale, wherein the dielectric layer is a stacked structure composed of oxide/nitride/oxide; and forming a control gate to cover the dielectric layer, wherein the material of the control gate is polysilicon or polycide. Furthermore, a source and a drain of the HSG flash memory cell of the present invention can be formed before the formation of the amorphous semiconductor film, or after the formation of the control gate, by using, for example, an ion implantation method, to dope ions into the substrate beside two sides of the channel region.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 2 to FIG. 15 are flow schematic diagrams of manufacturing a HSG flash memory cell in accordance with a preferred embodiment of the present invention, wherein FIG. 3 is a top view of FIG. 2, FIG. 7 is a top view of FIG. 6, FIG. 8 is a top view of FIG. 9, FIG. 10 is a top view of FIG. 11 and FIG. 12, and FIG. 13 is a top view of FIG. 14 and FIG. 15.

DETAILED DESCRIPTION OF THE PREFERRED EMBODIMENT

With the popularization of portable electron products, the demand of flash memory rises substantially. How to develop a new generation flash memory and scale down the size of flash memory cell has become a very important R & D trend. The present invention discloses a method for manufacturing a HSG flash memory cell. By applying the HSG flash memory cell of the present invention, the leakage current between a source and a drain can be improved effectively, and the cell current at on-state can be increased. In addition, a higher capacitor coupling ratio between a floating gate and a control gate is obtained to achieve the purpose for reducing a programming/erasing voltage of the flash memory cell. In order to make the illustration of the present invention more explicitly and completely, the following description and the drawings from FIG. 2 to FIG. 15 are stated.

Figure 1:
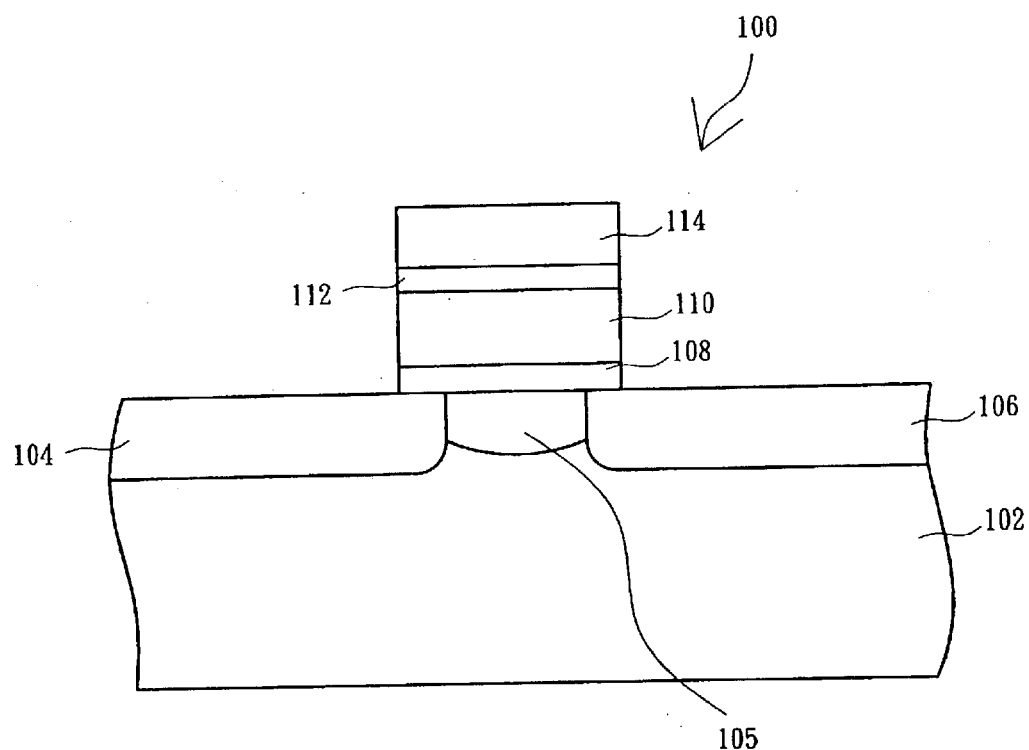
FIG. 1 is a cross-sectional view of a conventional stacked gate flash memory cell structure.
Figure 2:
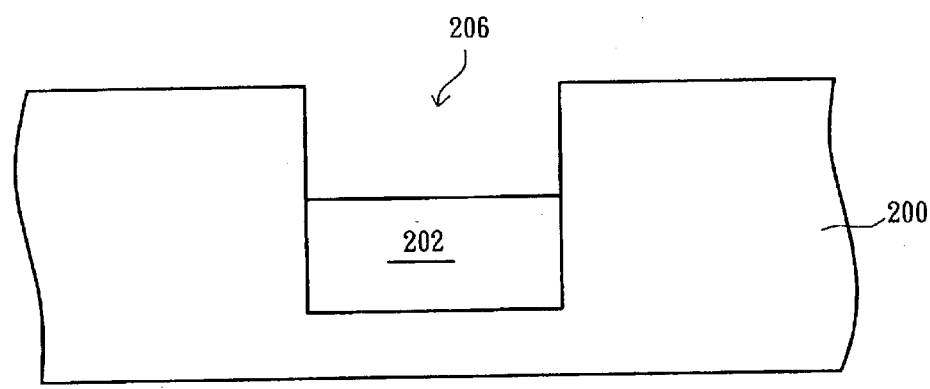
Figure 3:
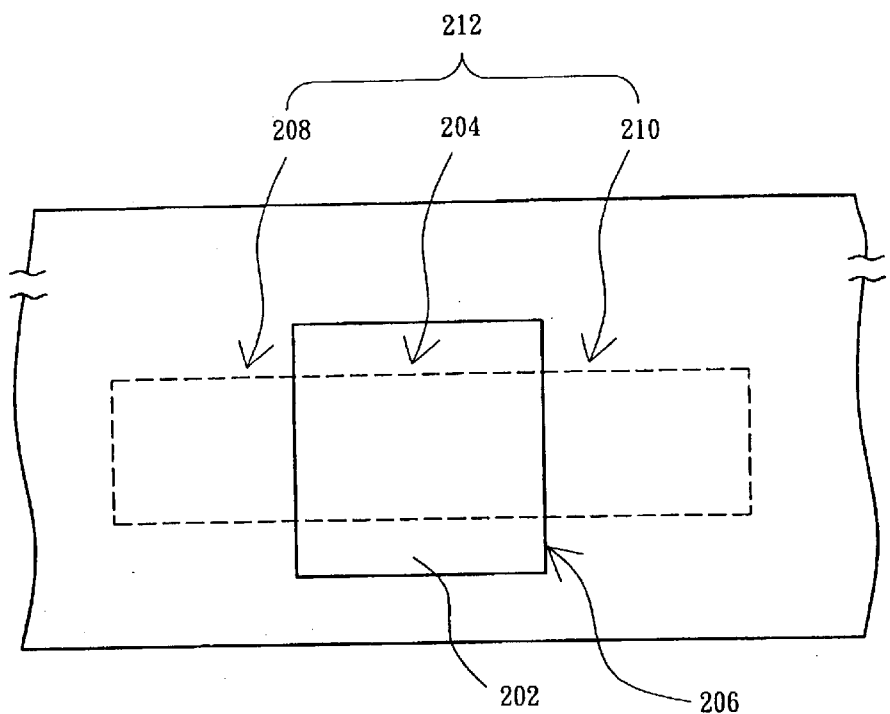

Referring to FIG. 2 and FIG. 3, FIG. 3 is a top view of FIG. 2. First, a plurality of isolation regions 202 (only show the isolation region 202 located in a predetermined device region 212) are formed on a semiconductor substrate 200, wherein the predetermined device region 212 mainly comprises of a source region 208, a channel region 204, and a drain region 210. At present, the isolation region 202 of a semiconductor device is usually fabricated by using a shallow trench isolation (STI) process. A trench-like opening is first formed on the substrate 200, and the trench-like opening is then filled with an insulating material to form the isolation region 202. In the present invention, the size of the isolation region 202 is larger than that of the channel region 204, as shown in FIG. 3. Then, a portion of the insulating material is removed by using, for example, an etching method, so as to form a shallower trench 206 on the isolation region 202.

Figure 4:
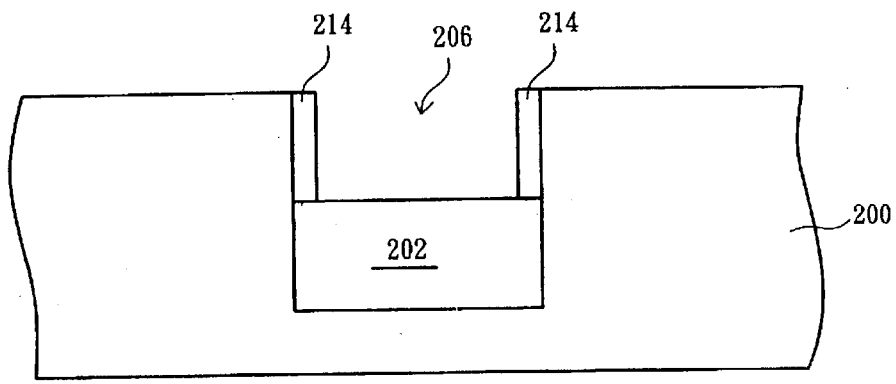
Figure 5:
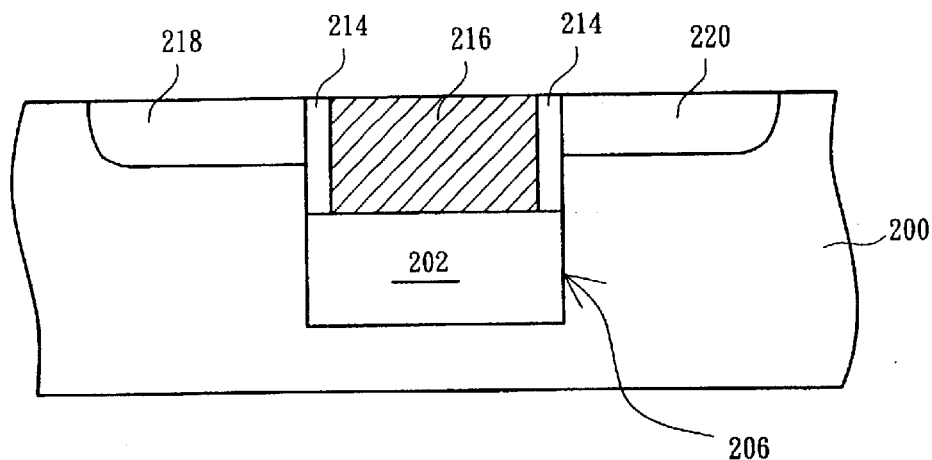

Referring to FIG. 4, after the trench 206 is formed, a dielectric film (only show the spacers 214) is first deposited to cover the substrate 200, the isolation region 202, and the trench 206. The dielectric film is etched by using, for example, an anisotropic etching method, to form spacers 214 beside the sidewall of the trench 206 on the isolation region 202. The material of the spacers 214 can be silicon oxide and silicon nitride, etc, and the spacers 214 can be used to isolate the gate and source 218/drain 220 (shown in FIG. 5) formed sequentially. At this time, a sacrificial layer 216 is formed to cover the substrate 200, the spacers 214, and the isolation region 202, and to fill the trench 206, wherein the sacrificial layer 216 is made of a dielectric material, such as silicon nitride and silicon oxide, etc. However, the material of the sacrificial layer 216 has to be different from the material of the spacers 214 to avoid damaging the spacers 214 during the removal of the sacrificial layer 216. The sacrificial layer 216 is preferred to have a chemical mechanical polishing (CMP) rate similar to the substrate 200, and to have a high etching selectivity with respect to both the spacers 214 and the isolation region 202. Then, the sacrificial layer 216 is planarized by, for example, a chemical mechanical polishing method, to remove the sacrificial layer 216 located on the substrate 200 and to reserve the sacrificial layer 216 in the trench 206. Ions are doped into the source region 208 and the drain region 210 on the substrate 200 by, for example, an implantation method, so that a source 218 and a drain 220 are formed beside the channel region 204, as shown in FIG. 5. As the source 218 and the drain 220 are $N^+$ type, the flash memory cell is N type; as the source 218 and the drain 220 are P+ type, the flash memory cell is P type. In addition, the source 218 and the drain 220 can be formed by an implantation method, etc, after the control gate structure of the flash memory cell is formed.

Figure 6:
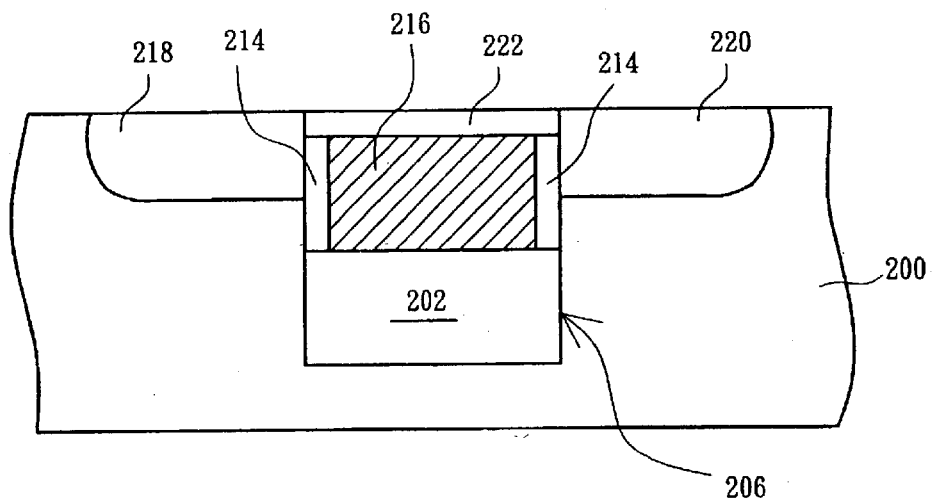
Figure 7:
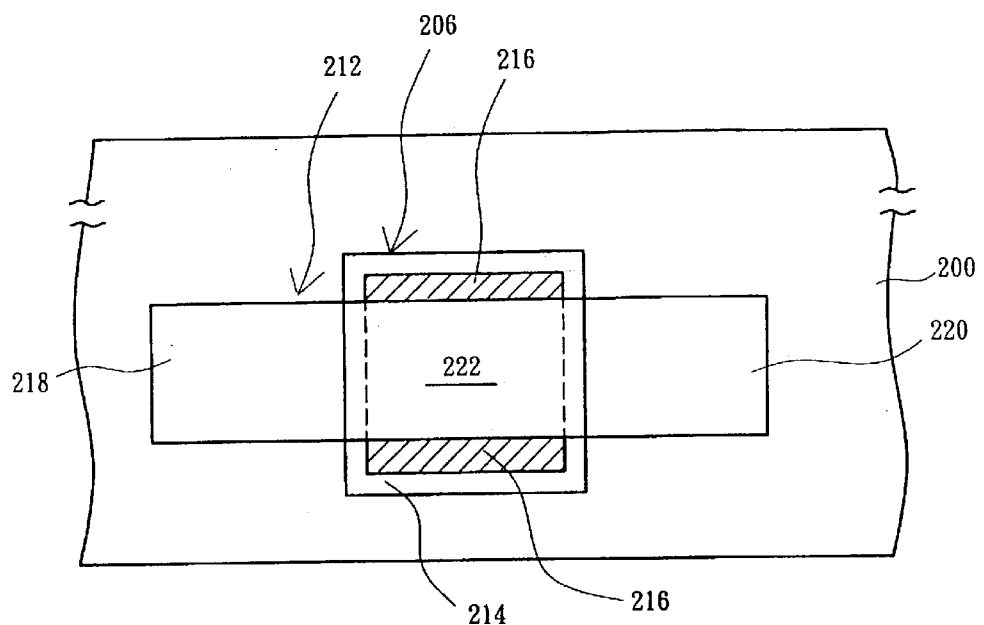

Referring to FIG. 6 and FIG. 7, FIG. 7 is a top view of the structure shown in FIG. 6. An amorphous semiconductor film (not shown) is deposited to cover the substrate 200, the source 218, the drain 220, the sacrificial layer 216, and the spacers 214. A re-crystallization step is performed on the amorphous semiconductor film by, for example, a solid phase epitaxy technique, so as to make the amorphous semiconductor film change into a single crystal silicon semiconductor film. The re-crystallization step of the amorphous semiconductor film is performed for a duration between about 0.5 hour and about 6 hours under a temperature between about 500° C. and about 600° C. As the amorphous semiconductor film on the substrate 200, the source 218, and the drain 220 will grow along the original lattice direction and integrate with the substrate 200, the source 218, and the drain 220. Hence, a crystallized semiconductor film 222 is formed on the sacrificial layer 216 and the spacers 214 on the isolation region 202. The crystallized semiconductor film 222 is doped with N type impurity (for P type flash memory cell) or P type impurity (for N type flash memory cell). However, the doping step can also be performed in-situ while the amorphous semiconductor layer is deposited. The crystallized semiconductor film 222 is connected with the source 218 and the drain 220 respectively to be used as the channel of the flash memory cell of the present invention. Then, the crystallized semiconductor film 222 outside the device region 212 is removed to expose a portion of the spacers 214 and a portion of the sacrificial layer 216, as shown in FIG. 7.

Figure 8:
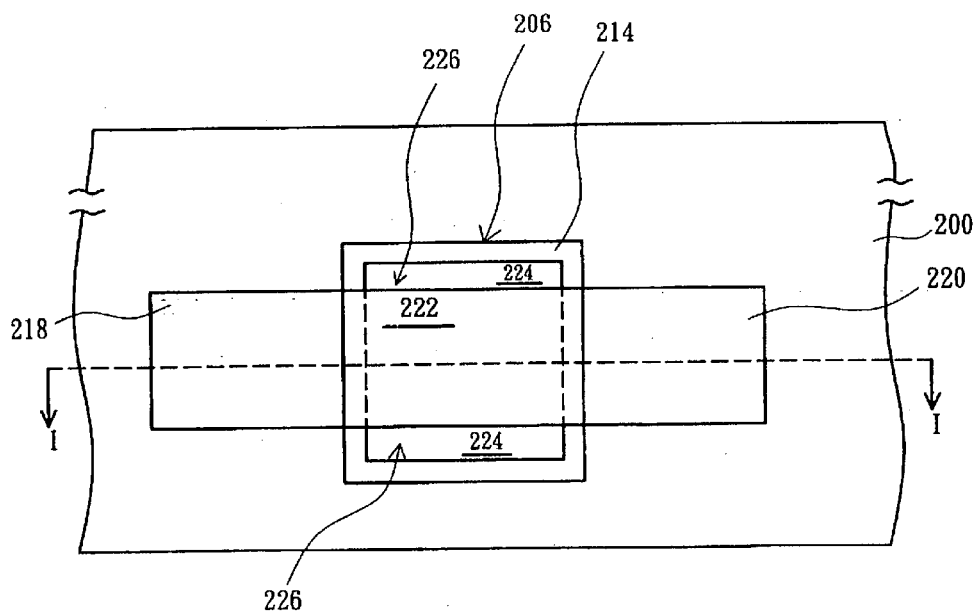
Figure 9:
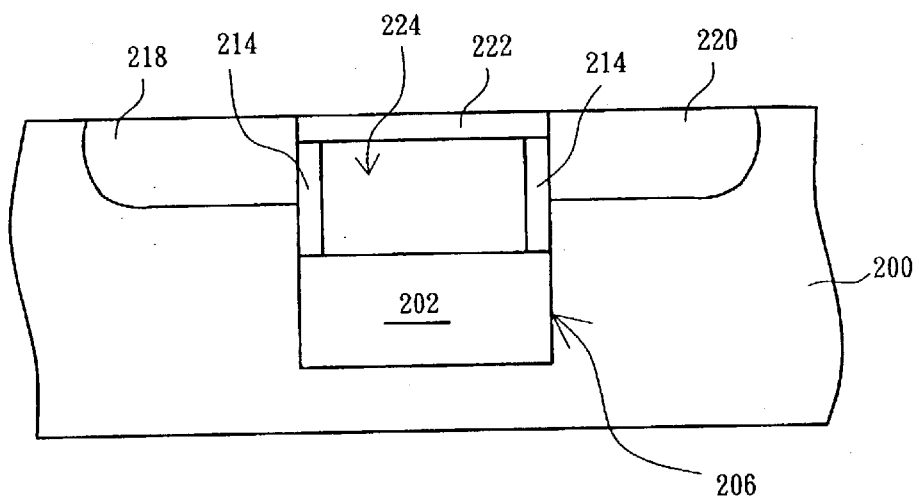

Referring to FIG. 8 and FIG. 9 simultaneously, FIG. 9 is a cross-sectional diagram alone hatch I—I in FIG. 8. The remainder of the sacrificial layer 216 is removed to expose the bottom of the trench 206 by performing an etching step along the exposed portion of the sacrificial layer 216. Accordingly, a hollow region 224 is formed between the crystallized semiconductor film 222, the spacers 214, and the bottom of the trench 206, as shown in FIG. 9. Furthermore, a plurality of slots 226 are formed between the crystallized semiconductor film 222 and the trench 206, as shown in FIG. 8.

Figure 10:
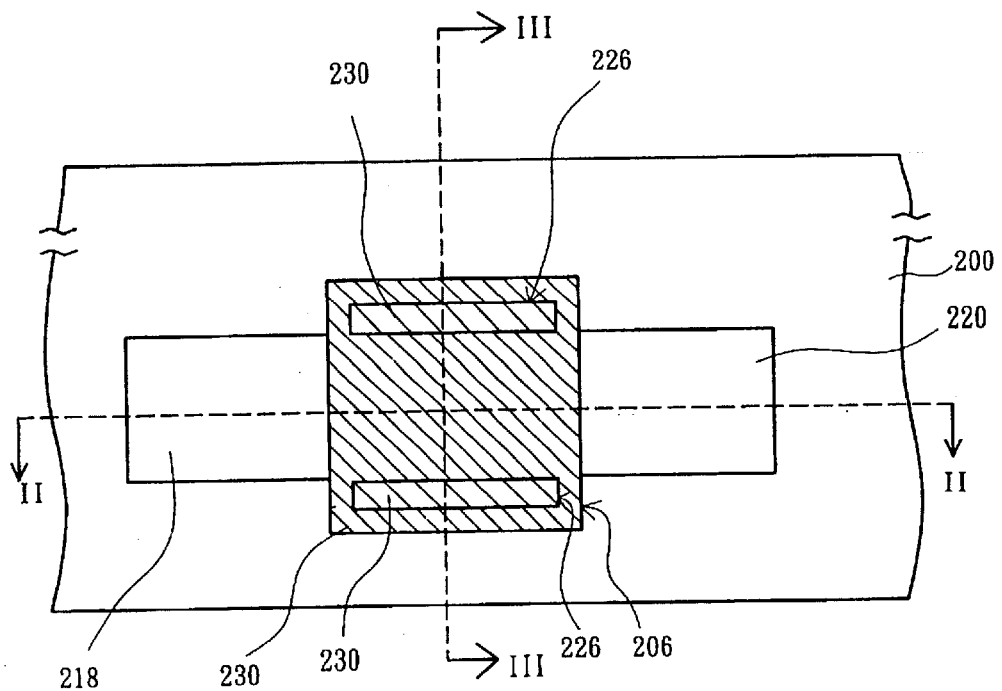
Figure 11:
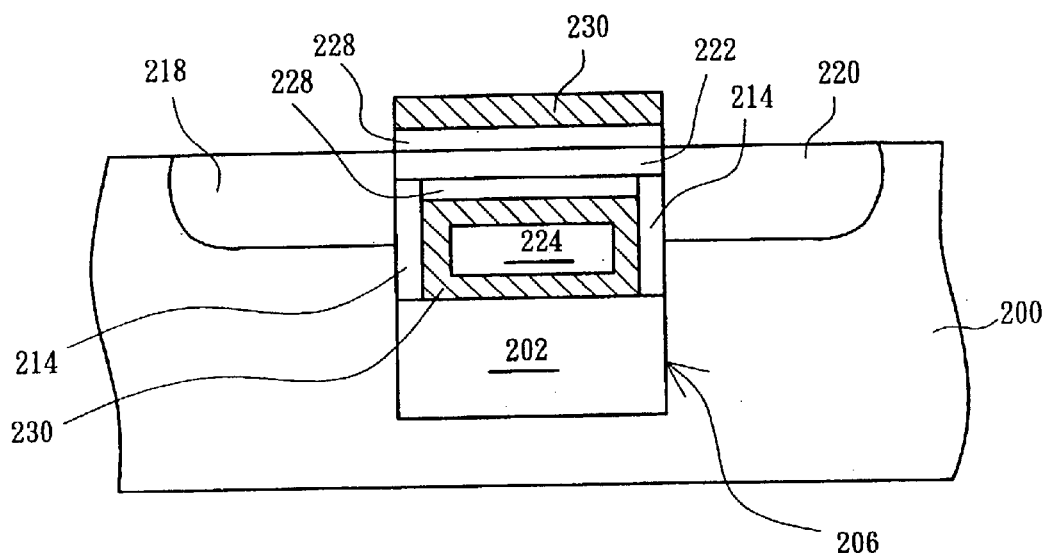
Figure 12:
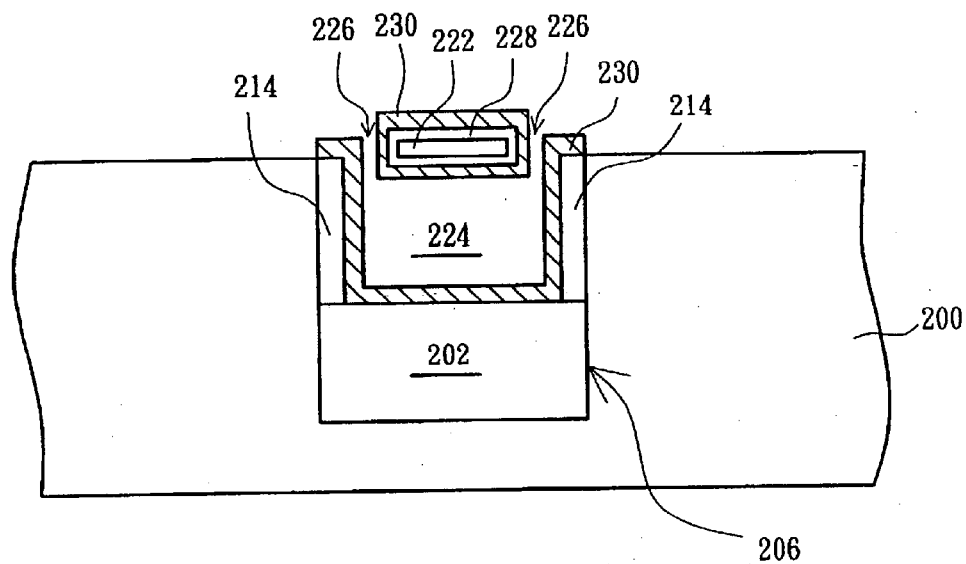

Then, referring to FIG. 10, FIG. 11, and FIG. 12, wherein FIG. 11 is a cross-sectional diagram alone hatch II—II in FIG. 10, and FIG. 12 is a cross-sectional diagram alone hatch III—III in FIG. 10. An oxide layer 228 is first formed to surround and encompass the crystallized semiconductor film 222, and to cover the substrate 200. The oxide layer 228 surrounding the crystallized semiconductor film 222 is used to as a tunneling oxide layer of the flash memory cell of the present invention, and in order to keep the device reliability, the thickness of the oxide layer 228 is preferred to be more than 80 Å, and is about 100 Å more preferably. Subsequently, a material, such as polysilicon and amorphous, of a floating gate 230 is deposited to surround and encompass the oxide layer 228, and to cover the bottom and the sidewall of the hollow region 224. The material of the floating gate 230 and the oxide layer 228 outside the trench 206 are removed by, for example, an anisotropic etching method, so that a structure shown in FIG. 11 and FIG. 12 is formed. As shown in FIG. 10 and FIG. 12, the slots 226 cannot be covered up or filled up to make sure that the subsequent material layers can be formed successfully.

Figure 13:
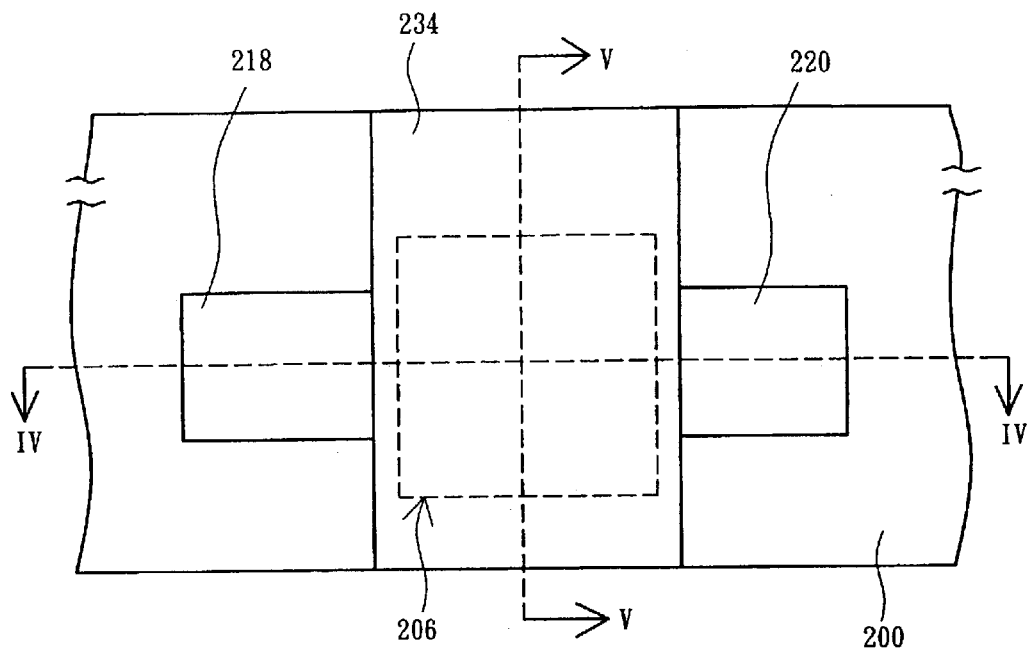
Figure 14:
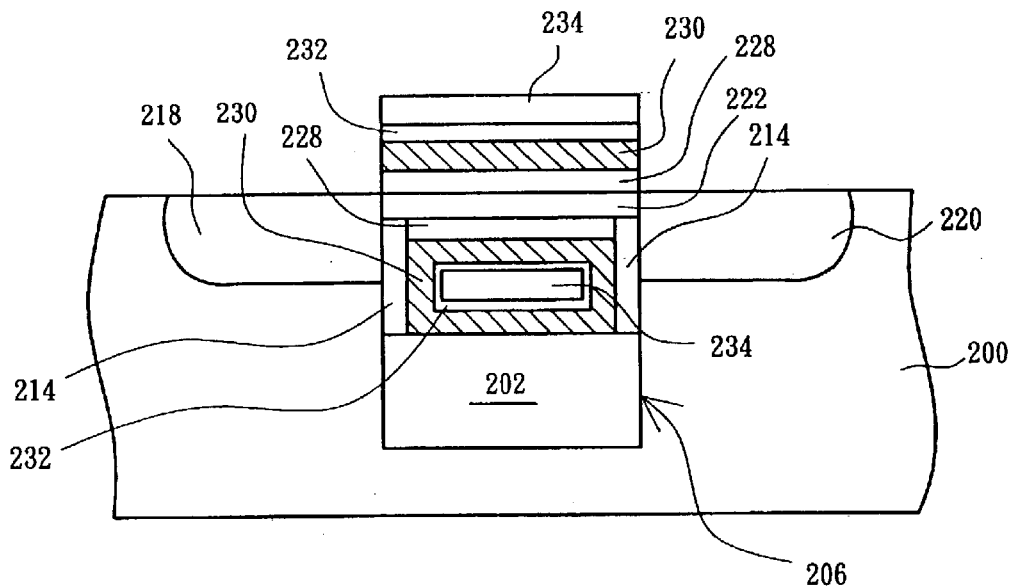
Figure 15:
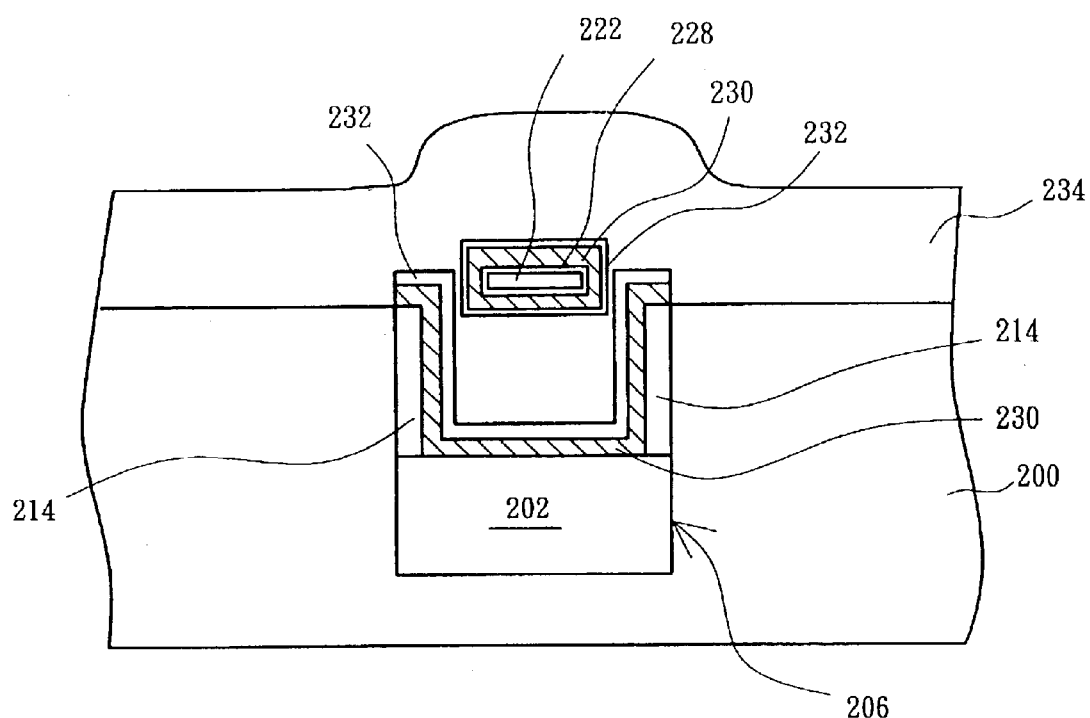

Referring to FIG. 13 to FIG. 15, FIG. 14 is a cross-sectional diagram alone hatch IV—IV in FIG. 13, and FIG. 15 is a cross-sectional diagram alone hatch V—V in FIG. 13. After the floating gate 230 is formed, a dielectric layer 232 is first formed to surround and encompass the floating gate 230 (including the floating gate 230 located in the trench 206) and the substrate 200. For example, the dielectric layer 232 can be an inter-poly dielectric layer, and the dielectric layer 232 can be an oxide/nitride/oxide (ONO) stacked material layer to provide a preferred blocking ability for preventing the chargers within the floating gate 230 from entering a control gate 234 though the dielectric layer 232. A material, such as amorphous, polysilicon, or polycide, of the control gate 234 is deposited to surround and encompass the dielectric layer 232 including the dielectric layer 232 in the trench 206. Then, the control gate 234 is patterned to complete the structure of the HSG flash memory cell of the present invention, as shown in FIG. 14 and FIG. 15.

The overlap area between the floating gate and the control gate 234 of the present invention can be adjusted by varying the depth of the hollow region 224 between the crystallized semiconductor film 222 and the bottom of the trench 206, and by this way, the capacitor coupling ratio between the floating gate 230 and the control gate 234 can also be improved.

The programming of the HSG flash memory cell of the present invention can use, for example, a channel hot electron injection (CHEI) method. The programming is performed by grounding the source 218 or setting the source 218 voltage to 0 V, setting the drain 220 voltage to about 3 V, and connecting the control gate 234 with a high voltage, such as about 12 V. The electrons of the source 218 are driven by the differential voltage between the source 218 and the drain 220 to pass through the channel, i.e. the crystallized semiconductor film 222, and move to the drain 220. The electrons are accelerated to have an increasing energy by the high channel electric field while moving in the crystallized semiconductor film 222. Especially, as the electrons are adjacent to the drain 220, the energy of the electrons is greatly increased, thereby inducing the hot electron effect. As a result of the hot electron effect, the electrons have enough energy to exceed the potential barrier of the oxide layer 228. At the same time, the attraction resulted from the high voltage of the control gate 234 drives the electrons to pass through the oxide layer 228 and inject into the floating gate 230 so as to complete the programming.

The erasing action of the HSG flash memory cell of the present invention can use, for example, a channel erasing method by means of the FN tunneling effect. The control gate 234 is grounded or supplied with a negative voltage, and the source 218 and/or drain 220 are supplied with a high voltage, such as about 12V. The electrons of the floating gate 230 are attracted to pass through the crystallized semiconductor film 222 into the source 218 and/or drain 220, so that the erasing of the data is completed.

An advantage of the present invention is that the channel of the HSG flash memory cell structure in the present invention is a crystallized semiconductor film surrounded and encompassed by a floating gate and a control gate. Therefore, not only the short channel effect can be avoided, but also the leakage current between a source and a drain can be improved effectively, and current can be conducted in the both sides of the channel, so that the flash memory cell current at on-state can be enhanced.

Another advantage of the present invention is that the overlap area between a floating gate and a control gate is increased by just increasing the depth of a trench without increasing the size of the flash memory cell. Therefore, the capacitor coupling ratio between the floating and the control gate is increased, and the purpose of reducing the programming/erasing voltage of the flash memory cell is obtained.

As is understood by a person skilled in the art, the foregoing preferred embodiments of the present invention are illustrations of the present invention rather than limitations of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing a horizontal surrounding gate (HSG) flash memory cell, comprising:

providing a substrate comprising a isolation region and a channel region formed thereon, wherein the size of the isolation region is larger than the size of the channel region, and the channel region is all surrounded by the isolation region, and the isolation region is filled with an insulating material;

removing a portion of the insulating material in the isolation region to form a trench on the isolation region in the substrate; forming a plurality of spacers in the trench and beside a sidewall of the trench;

forming a sacrificial layer to cover the isolation region, the trench, and the spacers, and the trench is filled up with the sacrificial layer;

forming an amorphous semiconductor film to cover the substrate, the spacers, and the sacrificial layer; performing a re-crystallization step to make the amorphous semiconductor film covering the substrate integrate into the substrate, and to make the amorphous semiconductor film located on the isolation region change into a crystallized semiconductor film;

removing a portion of the crystallized semiconductor film to leave an other portion of the crystallized semiconductor film located on the channel region, and to expose a portion of the spacers and a portion of the sacrificial layer;

forming an oxide layer to cover the other portion of the crystallized semiconductor film;

forming a floating gate to cover the oxide layer, a sidewall of the hollow region, and a bottom of the hollow region; forming a dielectric layer to cover the floating gate; and forming a control gate to cover the dielectric layer;

removing the sacrificial layer to expose a bottom of the trench, so as to form a hollow region constituted by the other portion of the crystallized semiconductor film, the spacers, and the bottom of the trench, and to form a plurality of slots between the other portion of the crystallized semiconductor film and the trench.

2. The method for manufacturing the HSG flash memory cell according to claim 1, wherein before the step of forming the amorphous semiconductor film is performed, the method further comprises forming a source and a drain in the substrate, and the source and the drain are located respectively beside two sides of the channel region.

3. The method for manufacturing the HSG flash memory cell according to claim 1, wherein after the step of forming the control gate is performed, the method further comprises forming a source and a drain in the substrate, and the source and the drain are located respectively beside two sides of the channel region.

4. The method for manufacturing the HSG flash memory cell according to claim 1, wherein the spacers is a dielectric material, and the sacrificial layer is an other dielectric material.

5. The method for manufacturing the HSG flash memory cell according to claim 1, wherein the sacrificial layer has a high etching selectivity to the substrate and the insulating material in the isolation region, and a chemical mechanical polishing (CMP) rate of the sacrificial layer is approximately equal to a chemical mechanical polishing rate of the substrate.

6. The method for manufacturing the HSG flash memory cell according to claim 1, wherein the temperature of performing the re-crystallization step is between about 500° C. and about 600° C., and the duration of the re-crystallization step is between about 0.5 hour and about 6 hours.

7. The method for manufacturing the HSG flash memory cell according to claim 1, wherein the other portion of the crystallized semiconductor film is a channel of the HSG flash memory cell.

8. The method for manufacturing the HSG flash memory cell according to claim 1, wherein the oxide layer is a tunneling oxide layer.

9. The method for manufacturing the HSG flash memory cell according to claim 1, wherein the material of the floating gate is polysilicon and the material of the control gate is polysilicon or polycide.

10. The method for manufacturing the HSG flash memory cell according to claim 1, wherein the dielectric layer is an inter-poly dielectric (IPD) layer, and the dielectric layer is an oxide/nitride/oxide (ONO) stacked structure.

* * * * *